US012231749B2

(12) United States Patent
Chao et al.

(10) Patent No.: US 12,231,749 B2
(45) Date of Patent: Feb. 18, 2025

(54) SENSING WITH LIQUID CRYSTAL POLARIZATION HOLOGRAMS AND METASURFACE

(71) Applicant: Meta Platforms Technologies, LLC, Menlo Park, CA (US)

(72) Inventors: Qing Chao, Redmond, WA (US); Lu Lu, Kirkland, WA (US); Xinqiao Liu, Medina, WA (US); Hao Yu, Kent, OH (US); Junren Wang, Redmond, WA (US)

(73) Assignee: Meta Platforms Technologies, LLC, Menlo Park, CA (US)

( * ) Notice: Subject to any disclaimer, the term of this patent is extended or adjusted under 35 U.S.C. 154(b) by 218 days.

(21) Appl. No.: 17/865,223

(22) Filed: Jul. 14, 2022

(65) Prior Publication Data
US 2023/0037261 A1    Feb. 2, 2023

Related U.S. Application Data

(60) Provisional application No. 63/226,916, filed on Jul. 29, 2021.

(51) Int. Cl.
| H04N 23/11 | (2023.01) |
| G02B 1/00 | (2006.01) |
| G02B 3/00 | (2006.01) |
| G02B 5/20 | (2006.01) |
| G02B 5/30 | (2006.01) |
| G02B 5/32 | (2006.01) |
| H04N 23/00 | (2023.01) |

(52) U.S. Cl.
CPC .......... *H04N 23/11* (2023.01); *G02B 3/0056* (2013.01); *G02B 5/201* (2013.01); *G02B 5/32* (2013.01); *G02B 1/002* (2013.01); *G02B 5/3016* (2013.01); *H04N 23/00* (2023.01)

(58) Field of Classification Search
None
See application file for complete search history.

(56) References Cited

U.S. PATENT DOCUMENTS

| 2014/0285703 | A1* | 9/2014 | Kizu | G02F 1/13306 |
| | | | | 348/340 |
| 2017/0109865 | A1 | 4/2017 | Kim et al. | |
| 2018/0143470 | A1 | 5/2018 | Oh et al. | |
| 2018/0217395 | A1 | 8/2018 | Lin et al. | |
| 2019/0000308 | A1* | 1/2019 | Duckett, III | G02B 23/2446 |
| 2020/0081315 | A1* | 3/2020 | Jamali | G02B 5/30 |
| 2020/0150425 | A1* | 5/2020 | Hatzilias | G02B 27/0093 |

OTHER PUBLICATIONS

International Preliminary Report on Patentability for International Application No. PCT/US2022/038909, mailed Feb. 8, 2024, 6 pages.

(Continued)

*Primary Examiner* — Mark T Monk
(74) *Attorney, Agent, or Firm* — Freestone Intellectual Property Law PLLC; Aaron J. Visbeek

(57) ABSTRACT

Imaging systems, cameras, and image sensors of this disclosure include imaging pixels that include subpixels. Diffractive optical elements such as a metasurface lens layers or a liquid crystal polarization hologram (LCPH) are configured to focus image light to the subpixels of the imaging pixels.

16 Claims, 12 Drawing Sheets

(56) References Cited

OTHER PUBLICATIONS

International Search Report and Written Opinion for International Application No. PCT/US2022/038909, mailed Jan. 11, 2023, 7 pages.

Andren D., et al., "Large-Scale Metasurfaces Made by an Exposed Resist," American Chemical Society, Photonics, 2020, vol. 7, pp. 885-892.

Hu Y., et al., "All-Dielectric Metasurfaces for Polarization Manipulation: Principles and Emerging Applications," Nanophotonics, 2020, vol. 9, No. 12, pp. 3755-3780.

Jiang M., et al., "Low F-Number Diffraction-Limited Pancharatnam-Berry Microlenses Enabled by Plasmonic Photopatterning of Liquid Crystal Polymers," Advanced Materials, Mar. 2019, 7 pages.

Shrestha S., et al., "Broadband Achromatic Dielectric Metalenses," Light: Science & Applications, 2018, vol. 7, Article 85, pp. 1-11.

Xu Z., et al, "Metasurface-Based Subtractive Color Filter Fabricated on a 12-inch Glass Wafer using a CMOS Platform," Photonics Research, Jan. 2021, vol. 9, No. 1, pp. 13-20.

\* cited by examiner

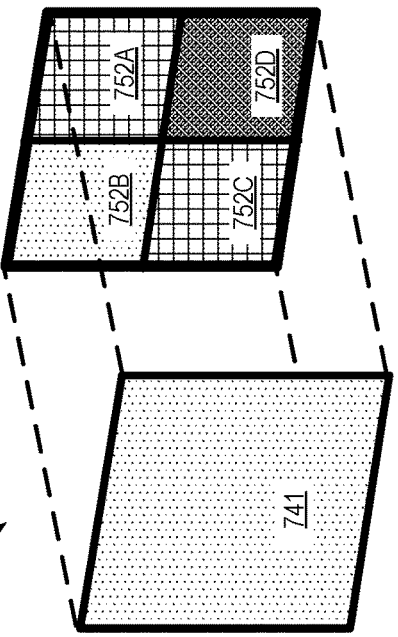
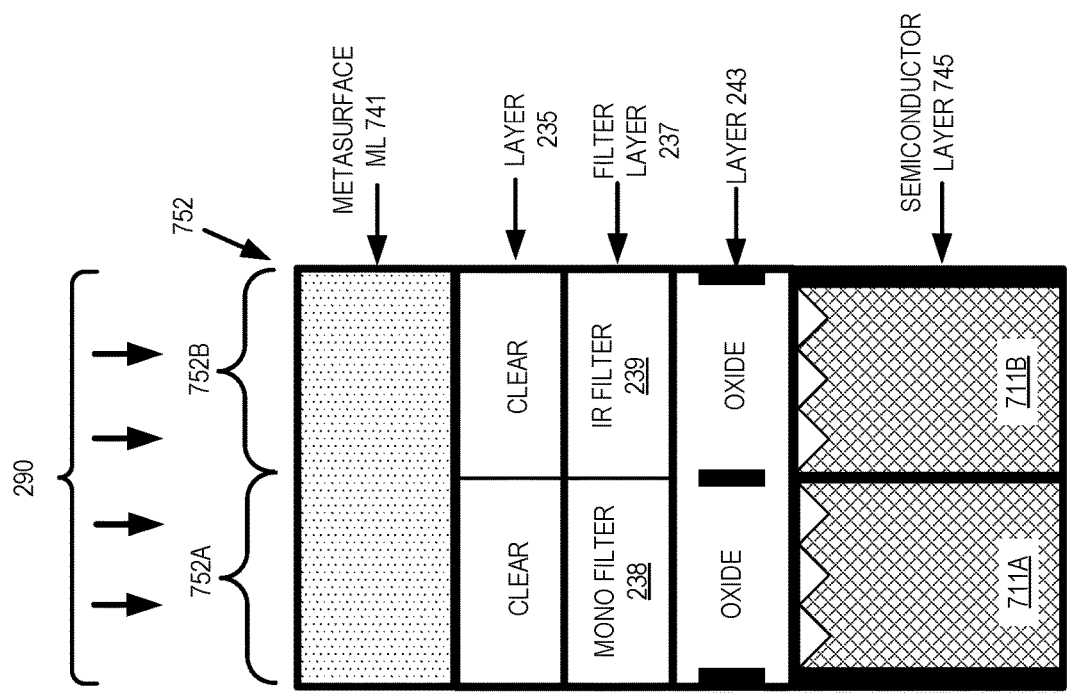
FIG. 7B
FIG. 7A

SENSING WITH LIQUID CRYSTAL POLARIZATION HOLOGRAMS AND METASURFACE

CROSS-REFERENCE TO RELATED APPLICATIONS

This application claims priority to U.S. provisional Application No. 63/226,916 filed Jul. 29, 2021, which is hereby incorporated by reference.

TECHNICAL FIELD

This disclosure relates generally to optics, and in particular to sensing applications.

BACKGROUND INFORMATION

Optical components in devices include refractive lenses, diffractive lenses, color filters, neutral density filters, and polarizers. In imaging applications such as cameras, refractive lenses and microlenses are used to focus image light to a sensor.

BRIEF DESCRIPTION OF THE DRAWINGS

Non-limiting and non-exhaustive embodiments of the invention are described with reference to the following figures, wherein like reference numerals refer to like parts throughout the various views unless otherwise specified.

FIGS. 7A-7B illustrate an example imaging pixel that includes subpixels, in accordance with aspects of the disclosure.

DETAILED DESCRIPTION

Embodiments of liquid crystal polarization holograms (LCPH) and metasurfaces in imaging contexts are described herein. In the following description, numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

In aspects of this disclosure, visible light may be defined as having a wavelength range of approximately 380 nm-700 nm. Non-visible light may be defined as light having wavelengths that are outside the visible light range, such as ultraviolet light and infrared light. Infrared light having a wavelength range of approximately 700 nm-1 mm includes near-infrared light. In aspects of this disclosure, near-infrared light may be defined as having a wavelength range of approximately 700 nm-1.6 μm. In aspects of this disclosure, the term "transparent" may be defined as having greater than 90% transmission of light. In some aspects, the term "transparent" may be defined as a material having greater than 90% transmission of visible light.

Conventional image sensors use polarizers, wavelength filters, and refractive microlenses to filter and focus image light to imaging pixels and subpixels of a sensor. However, these conventional components add bulk to sensors and may also cause resolution issues and reduce a signal-to-noise ratio (SNR) of the sensor. Implementations of the disclosure include liquid crystal polarization holograms (LCPH) and metasurfaces configured with the functionality of one or more of polarizers, wavelength filters, and/or microlenses to be used to replace conventional optical components in sensing application (e.g. an image sensor). These and other embodiments are described in more detail in connection with FIGS. 1-17C.

Figure 1:
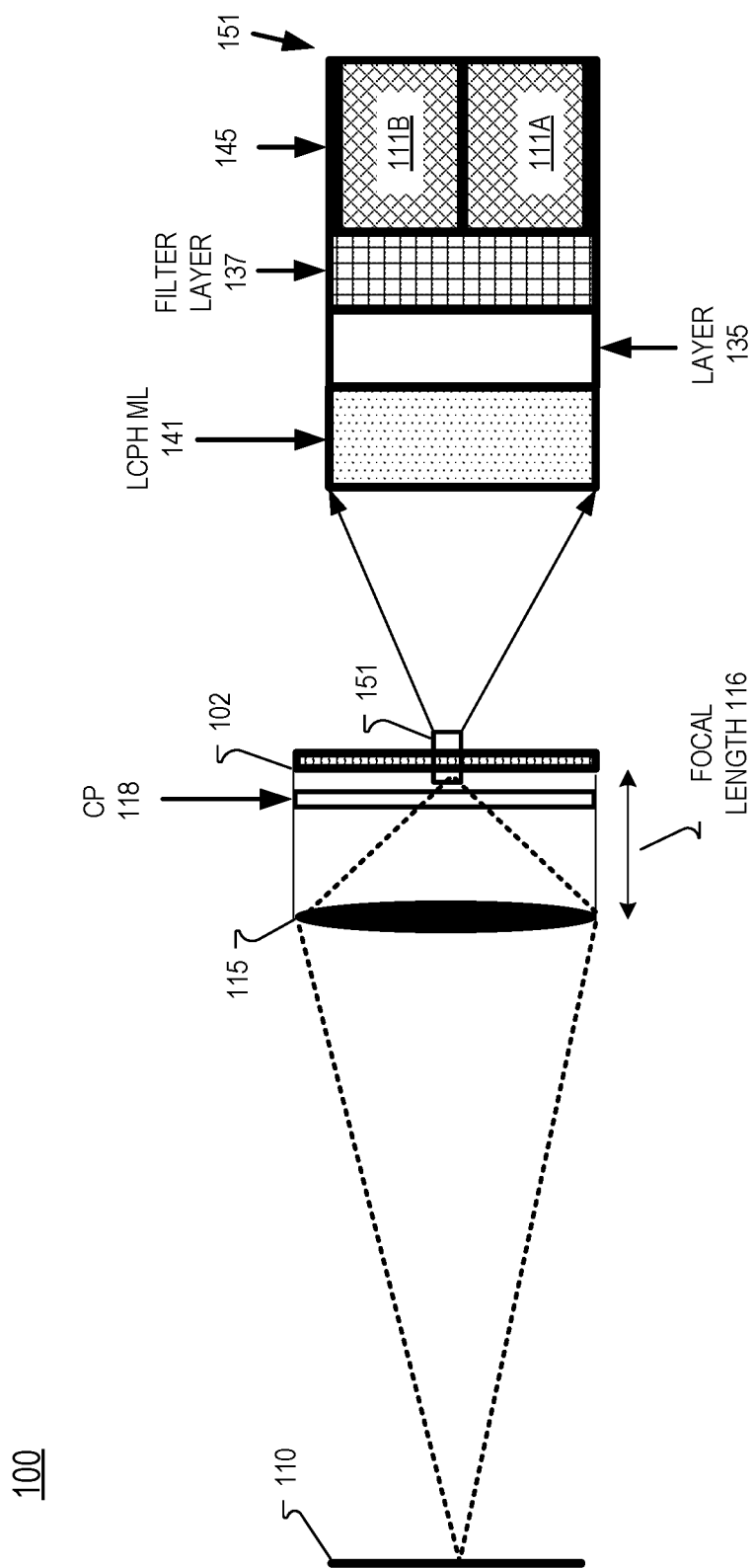
FIG. 1 illustrates a sensing system that includes a patterned liquid crystal polarization holograms (LCPH) layer having microlens regions configured to focus image light to different subpixels of an image sensor, in accordance with aspects of the disclosure.

FIG. 1 illustrates an imaging system 100 that includes a patterned LCPH layer 141 having microlens regions configured to focus image light to different subpixels of an image pixel array 102, in accordance with implementations of the disclosure. Imaging system 100 includes a focusing element 115 having a focal length 116, and an image pixel array 102. Image pixel array 102 may be implemented as a complementary metal-oxide semiconductor (CMOS) image sensor, in some implementations. Focusing element 115 focuses image light scattered/reflected from object 110 to image pixel array 102. Image pixel array 102 includes a plurality of imaging pixels such as imaging pixel 151. Example imaging pixel 151 includes a first subpixel 111A and a second subpixel 111B. A filter layer 137 may include different wavelength filters (e.g. red, green, blue, infrared, near-infrared, ultraviolet) to filter the wavelength of image light that propagates to a semiconductor layer 145 (e.g. silicon) of imaging pixel 151. A spacer layer 135 may be disposed between patterned LCPH layer 141 and filter layer 137. Spacer layer 135 may include Deep Trench Interface (DTI) or Buried Shielding Metal (BSM), for example.

Patterned LCPH layer 141 includes microlens regions for focusing the image light to subpixels 111A and 111B. A circular polarizer 118 may be disposed between focusing element 115 and image pixel array 102 to provide circularly polarized image light to patterned LCPH layer 141 that covers all or a portion of image pixel array 102. Although not particularly illustrated, a patterned LCPH layer 141 may be disposed over image pixel array 102 where the patterned LCPH layer 141 includes various microlens regions that are disposed over each imaging pixel with a one-to-one correspondence. In an implementation, patterned LCPH layer 141 includes microlens regions having a one-to-one correspondence with subpixels (e.g. 111A and 111B) of the imaging pixels 151.

Figure 2B:
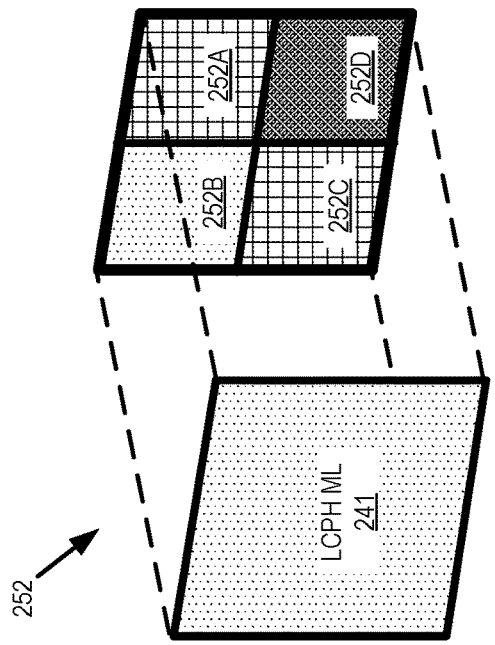
FIGS. 2A-2B illustrate an example imaging pixel that includes subpixels, in accordance with aspects of the disclosure.
Figure 2A:
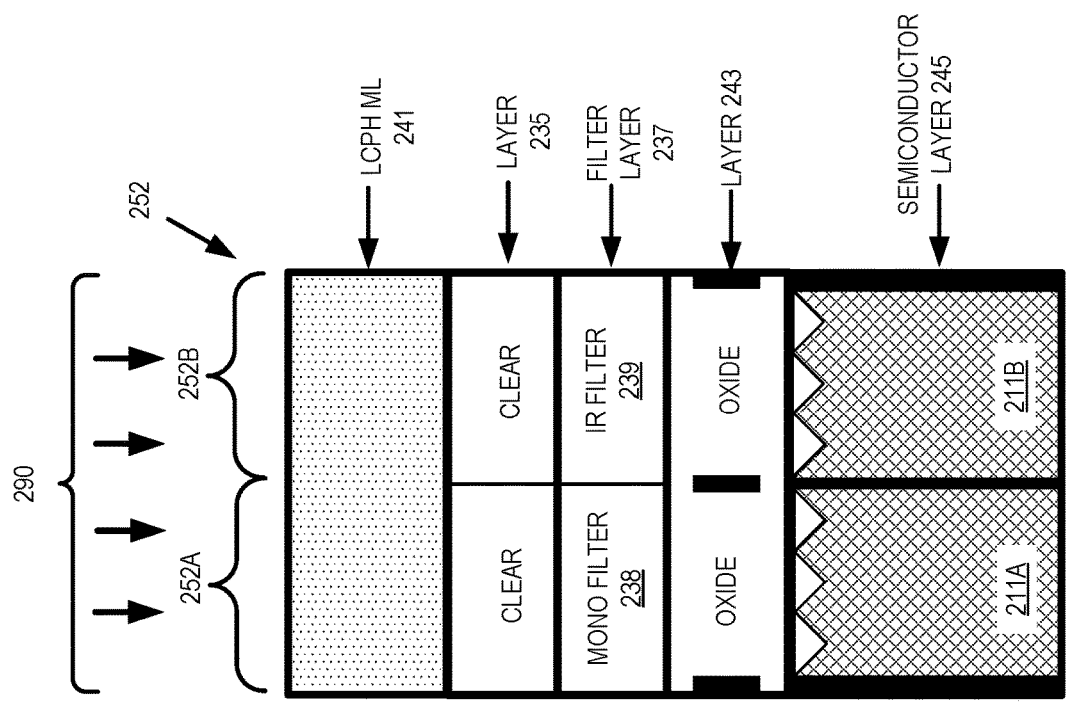

FIG. 2A illustrates a side view of an example imaging pixel 252 that includes subpixels 252A and 252B, in accordance with implementations of the disclosure. FIG. 2A illustrates image light 290 encountering patterned LCPH layer 241. Patterned LCPH layer 241 is disposed over the imaging pixels (e.g. imaging pixel 252) of an image pixel array (e.g. image pixel array 102). Example imaging pixel 252 includes subpixel 252A and subpixel 252B in FIG. 2A. FIG. 2B illustrates a perspective view of example imaging pixel 252 including four subpixels 252A, 252B, 252C, and 252D.

FIG. 2A shows subpixel 252A as a monochrome subpixel that measures/senses the intensity of visible light while subpixel 252B is illustrated as an infrared subpixel. Subpixel 252B may be configured to measure/sense a particular band of infrared light (e.g. 800 nm light) or to measure/sense broad-spectrum infrared light having a wavelength higher than visible red light. Subpixel 252A includes a filter 238 in filter layer 237 that may be configured to pass visible light (while rejecting/blocking non-visible light) to a sensing region 211A in a semiconductor layer 245 of imaging pixel 252. Filter 238 may be an infrared stop filter that blocks/rejects infrared light while passing visible light. Subpixel 252B includes a filter 239 that may be configured to pass broad-spectrum infrared light (e.g. ~700 nm-3000 nm) or narrow-band infrared light (e.g. 795 nm to 805 nm) to sensing region 211B in a semiconductor layer 245 of imaging pixel 252. Sensing region 211A of subpixel 252A and sensing region 211B of subpixel 252B may be implemented in doped silicon included in semiconductor layer 245. Deep Trench Isolation (DTI) and metal layers may separate the sensing regions of different subpixels. Each subpixel of imaging pixel 252 may be 1-2 microns.

FIG. 2A shows that layer 235 may be disposed between LCPH layer 241 and filter layer 237. Layer 235 may include DTI and/or back side metal (BSM). Optional oxide layer 243 is shown disposed between semiconductor layer 245 and filter layer 237. Oxide layer 243 may include silicon dioxide. Oxide layer 243 may include BSM. The BSM may include Tungsten and one or more layers of titanium-nitride. Wavelength filtering layer 237 may include example filters 238 and 239 in addition to other wavelength filters disposed above subpixels 252C and 252D. Layer 237 is disposed between semiconductor layer 245 and patterned LCPH layer 241. Those skilled in the art appreciate that layers 235, 237, layer 243, and layer 245 may extend to many imaging pixels in an image pixel array even though FIG. 2A only illustrates a single imaging pixel 252.

FIG. 2B illustrates that example imaging pixel includes four subpixels where two of the subpixels (252A and 252C) may be mono subpixels configured to measure/sense an intensity of image light 290 and one subpixel 252B that may be configured to measure/sense infrared light. Other wavelength filters and different filter patterns may also be used in imaging pixels, in accordance with implementations of the disclosure. Subpixel 252D may include a red, green, or blue filter that passes red, green, or blue light to a sensing region of subpixel 252D. In some implementations, imaging pixels include a red-green-green-blue (RGGB) filter pattern, for example. Each subpixel of imaging pixel 252 may be 1-2 microns.

In FIG. 2B, patterned LCPH layer 241 includes microlens regions configured to focus image light 290 to subpixels 252A, 252B, 252C, and 252D. In an implementation, patterned LCPH layer 241 is implemented with a liquid crystal Pancharatnam-Berry Phase (LC-PBP) design. In an implementation, patterned LCPH layer 241 includes a polarized volume hologram (PVH) design. In an implementation, the liquid crystals in patterned LCPH layer 241 are doped with color dye to provide a filter for specific wavelength bands or to block specific wavelengths. Certain microlens regions of patterned LCPH layer 241 may be doped to pass a particular wavelength band of image light 290 while other microlens regions of patterned LCPH layer 241 may be doped to pass other (different) wavelength band(s) of image light 290, for example.

Figure 3:
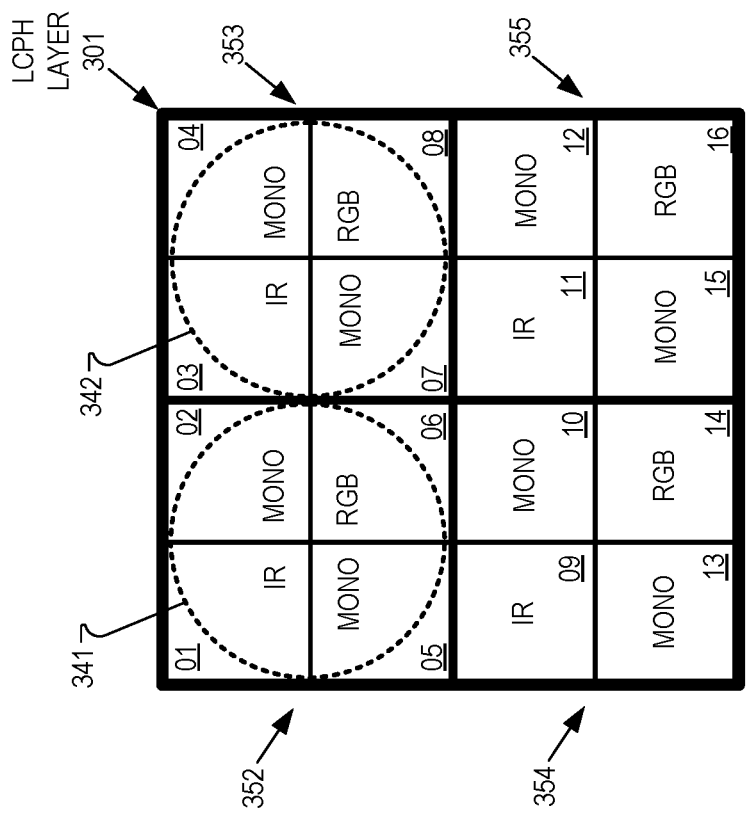
FIG. 3 illustrates a patterned LCPH layer arranged with microlens regions to be disposed over subpixels, in accordance with aspects of the disclosure.

FIG. 3 illustrates a patterned LCPH layer 301 arranged with microlens regions to be disposed over subpixels, in accordance with aspects of the disclosure. In FIG. 3, microlens region 341 is illustrated as a round or oval microlens region configured to focus image light to four subpixels 01, 02, 05, and 06 of imaging pixel 352. Hence, microlens region 341 has a one-to-one correspondence with imaging pixel 352. In other words, patterned LCPH layer 301 is patterned to have a microlens region to focus image light (e.g. image light 290) for each imaging pixel. Subpixel 01 is configured to measure/sense infrared light, subpixel 02 is configured to measure/sense the intensity of visible light, subpixel 05 is configured to measure/sense the intensity of visible light, and subpixel 06 is configured to measure/sense red, green, or blue light. Of course, the different subpixels may be configured to sense different wavelengths of light by changing the filters in the filter layer of the subpixel.

Microlens region 342 is disposed over imaging pixel 353. Microlens region 342 is illustrated as a round or oval microlens region configured to focus image light to four subpixels 03, 04, 07, and 08 of imaging pixel 353. Hence, microlens region 342 has a one-to-one correspondence with imaging pixel 353. Subpixel 03 is configured to measure/sense infrared light, subpixel 04 is configured to measure/sense the intensity of visible light, subpixel 07 is configured to measure/sense the intensity of visible light, and subpixel 08 is configured to measure/sense red, green, or blue light. While not particularly illustrated, an oval, circular, or rectangular microlens region of patterned LCPH layer 301 may be disposed over subpixels 09, 10, 13, and 14 of imaging pixel 354. And, an oval, circular, or rectangular microlens region of patterned LCPH layer 301 may be disposed over subpixels 11, 12, 15, and 16 of imaging pixel 355.

Patterned LCPH layer 301 may be a contiguous layer. A contiguous patterned LCPH layer 301 may cover an entire image pixel array where the image pixel array includes thousands or millions of imaging pixels.

Figure 4:
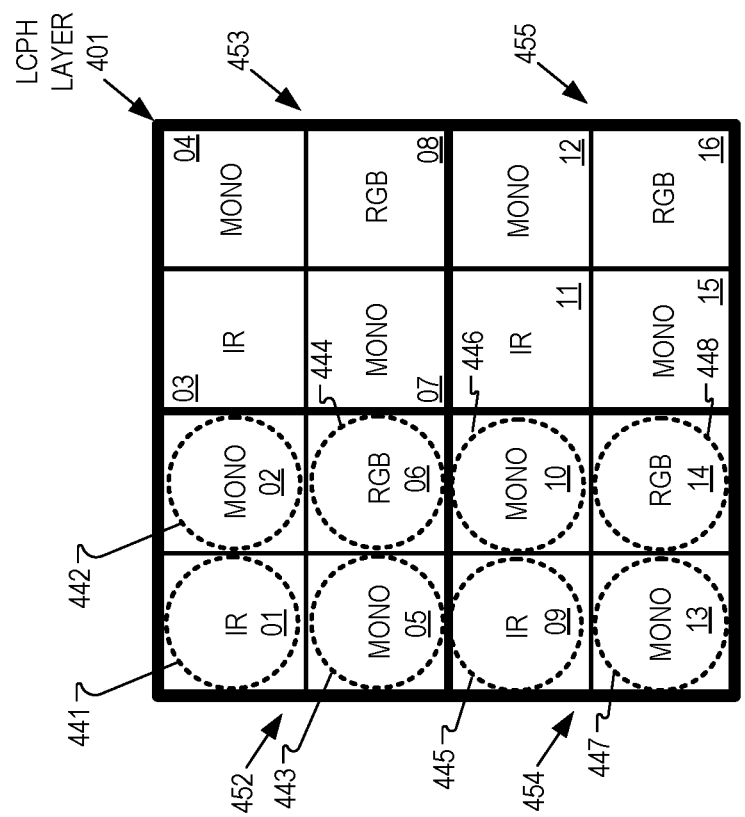
FIG. 4 illustrates a patterned LCPH layer including microlens regions having a one-to-one correspondence with subpixels of the imaging pixels, in accordance with aspects of the disclosure.

FIG. 4 illustrates a patterned LCPH layer 401 including microlens regions having a one-to-one correspondence with subpixels of the imaging pixels, in accordance with aspects of the disclosure. In FIG. 4, microlens region 441 is illustrated as a round or oval microlens region configured to focus image light to one subpixel (subpixel 01). Microlens region 442 is configured to focus image light to subpixel 02, microlens region 443 is configured to focus image light to subpixel 05, and microlens region 444 is configured to focus image light to subpixel 06. Hence, microlens regions of patterned LCPH layer 401 have a one-to-one correspondence with subpixels of imaging pixel 452 that includes subpixels 01, 02, 05, and 06. Similarly, microlens regions 445, 446, 447, and 448 of patterned LCPH layer 401 have a one-to-one correspondence to subpixels 09, 10, 13, and 14, respectively, of imaging pixel 454. In other words, patterned LCPH layer 401 is patterned to have a microlens regions to focus image light (e.g. image light 290) for each subpixel in FIG. 4.

Still referring to FIG. 4, subpixel 01 is configured to measure/sense infrared light, subpixel 02 is configured to measure/sense the intensity of visible light, subpixel 05 is configured to measure/sense the intensity of visible light, and subpixel 06 is configured to measure/sense red, green, or blue light. Of course, the different subpixels may be configured to sense different wavelengths of light by changing the filters in the filter layer of the subpixel. While not particularly illustrated, an oval, circular, or rectangular microlens region of patterned LCPH layer 401 may be disposed (individually) over subpixels 03, 04, 07, and 08 of imaging pixel 453. And, an oval, circular, or rectangular microlens region of patterned LCPH layer 401 may be disposed (individually) over subpixels 11, 12, 15, and 16 of imaging pixel 455.

In some implementations, the microlens regions of patterned LCPH layer 401 are configured to pass different wavelengths of light. For example, microlens region 441 may be doped with a color dye that functions as a filter and microlens region 442 may be doped with a different color dye that functions as a filter that filters different wavelengths of light. A first microlens region may be configured to pass a first wavelength band of image light to a first subpixel and not a second subpixel and a second microlens region may be configured to pass a second (different) wavelength band of image light to the second subpixel and not the first subpixel.

Patterned LCPH layer 401 may be a contiguous layer. A contiguous patterned LCPH layer 401 may cover an entire image pixel array where the image pixel array includes thousands or millions of imaging pixels. Patterned LCPH layer 301 and/or patterned LCPH layer 401 may be considered "patterned" because the microlens regions are arranged, sized, and/or configured to focus image light onto subpixels or imaging pixels of an image pixel array.

Figure 5:
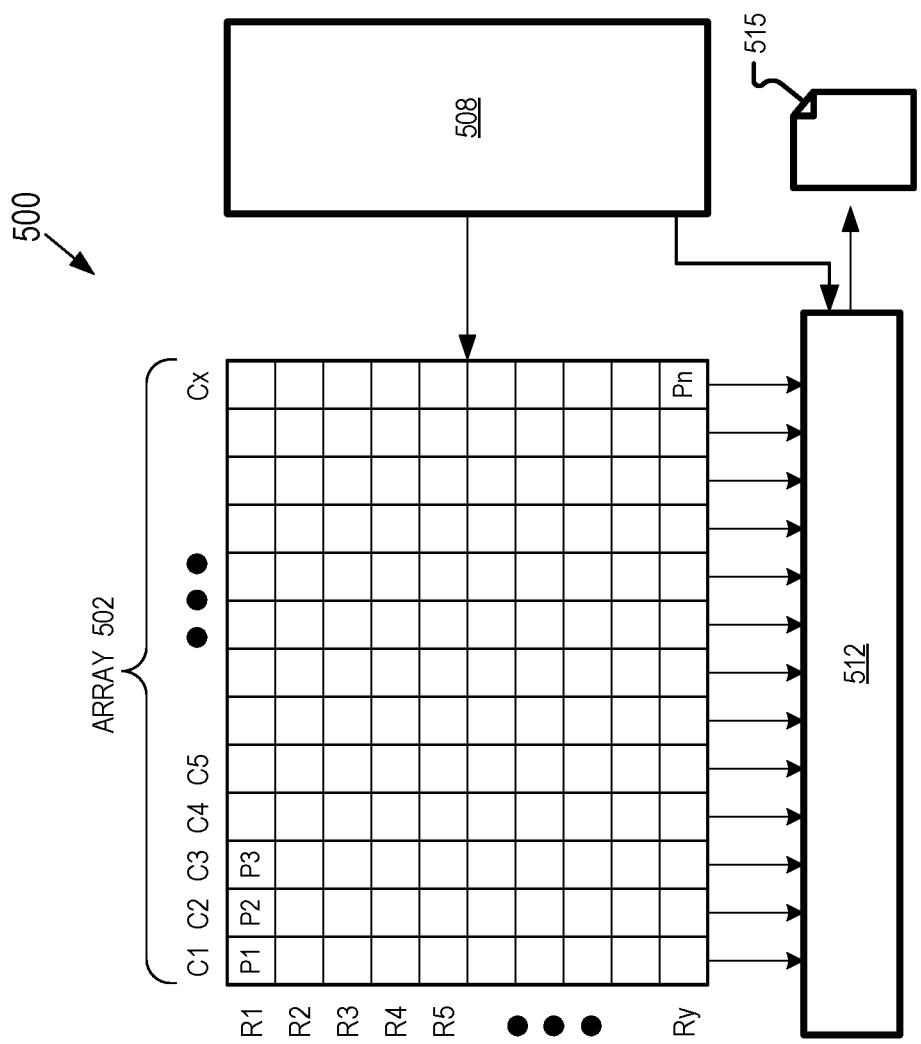
FIG. 5 illustrates an example imaging system including an image pixel array, in accordance with aspects of the disclosure.

FIG. 5 illustrates an imaging system 500 including an image pixel array 502, in accordance with aspects of the disclosure. All or portions of imaging system 500 may be included in an image sensor, in some implementations. Imaging system 500 includes control logic 508, processing logic 512, and image pixel array 502. Image pixel array 502 may be arranged in rows and columns where integer y is the number of rows and integer x is the number of columns. The image pixel array 502 may have a total of n pixel (P) and integer n may be the product of integer x and integer y. In some implementations, n is over one million imaging pixels. Each imaging pixel may include subpixels described in the disclosure.

In operation, control logic 508 drives image pixel array 502 to capture an image. Image pixel array 502 may be configured to have a global shutter or a rolling shutter, for example. Each subpixel may be configured in a 3-transistor (3T) or 4-transistor (4T) readout circuit configuration. Processing logic 512 is configured to receive the imaging signals from each subpixel. Processing logic 512 may perform further operations such as subtracting or adding some imaging signals from other imaging signals to generate image 515. Aspects of a patterned LCPH layer in accordance with FIGS. 1-4 of this disclosure may be disposed over image pixel array 502 in imaging system 500. In an implementation, patterned LCPH layer 301 is disposed over image pixel array 502 in imaging system 500. In an implementation, patterned LCPH layer 401 is disposed over image pixel array 502 in imaging system 500.

Figure 6:
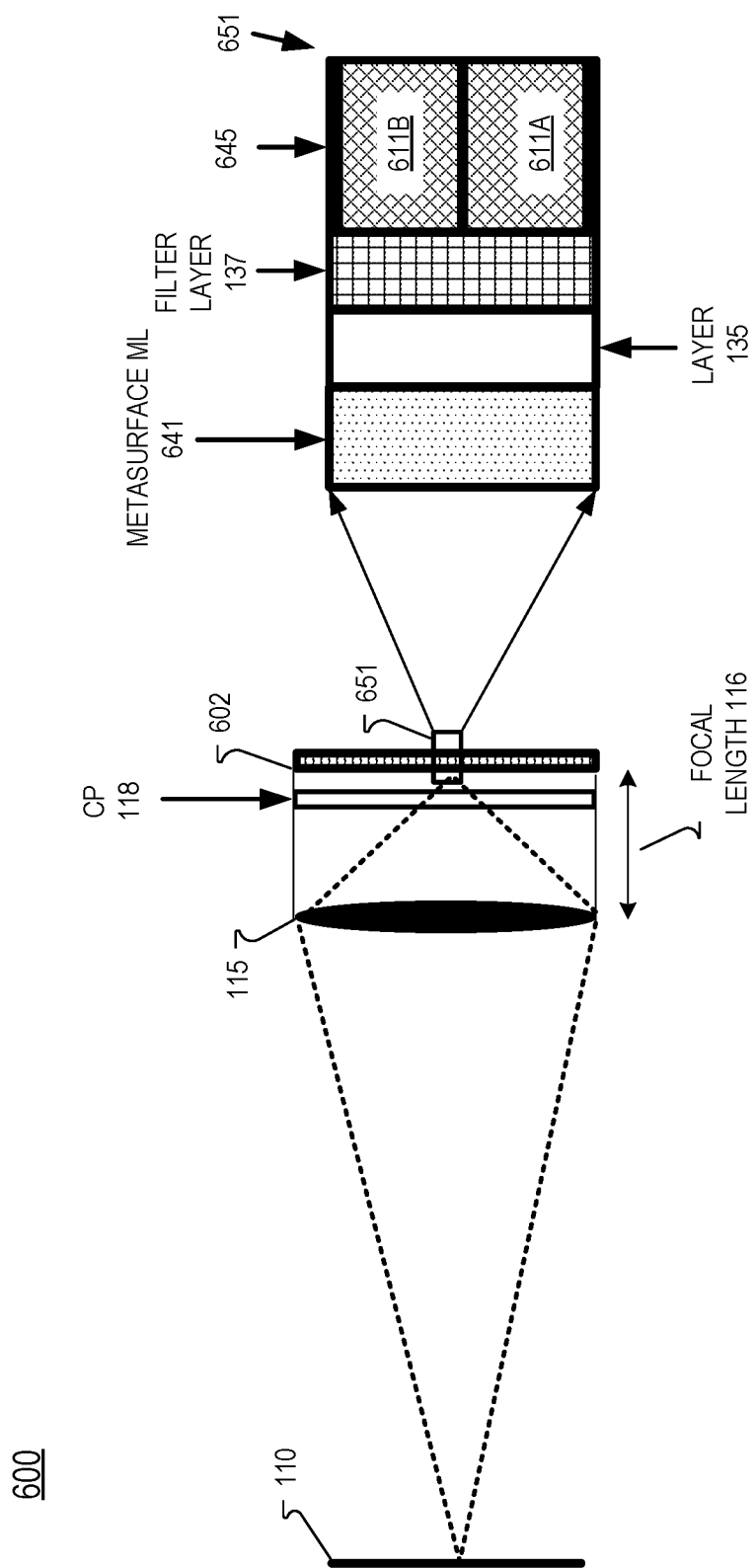
FIG. 6 illustrates a sensing system that includes a metasurface lens layer having microlens regions configured to focus image light to different subpixels of an image sensor, in accordance with aspects of the disclosure.

FIG. 6 illustrates an imaging system 600 that includes a metasurface lens layer 641 having microlens regions configured to focus image light to different subpixels of an image pixel array 602, in accordance with implementations of the disclosure. Imaging system 600 includes a focusing element 115 having a focal length 116, and an image pixel array 602. Image pixel array 602 may be implemented as a complementary metal-oxide semiconductor (CMOS) image sensor, in some implementations. Focusing element 115 focuses image light scattered/reflected from object 110 to image pixel array 602. Image pixel array 602 includes a plurality of imaging pixels such as imaging pixel 651. Imaging pixel 651 includes a first subpixel 611A and a second subpixel 611B. A filter layer 137 may include different wavelength filters (e.g. red, green, blue, infrared, near-infrared) to filter the wavelength of image light that propagates to a semiconductor layer 645 (e.g. silicon) of imaging pixel 651. A spacer layer 135 may be disposed between metasurface lens layer 641 and filter layer 137. Spacer layer 135 may include Deep Trench Interface (DTI) or Buried Shielding Metal (BSM), for example.

Metasurface lens layer 641 includes microlens regions for focusing the image light to subpixels 611A and 611B. A circular polarizer 118 may be disposed between focusing element 115 and image pixel array 602 to provide circularly polarized image light to metasurface lens layer 641. Although not particularly illustrated, a metasurface lens layer 641 may be disposed over image pixel array 602 where the metasurface lens layer 641 includes various microlens regions that are disposed over each imaging pixel with a one-to-one correspondence. In an implementation, metasurface lens layer 641 includes microlens regions having a one-to-one correspondence with subpixels (e.g. 611A and 611B) of the imaging pixels 651.

FIG. 7A illustrates a side view of an example imaging pixel 752 that includes subpixels 752A and 752B, in accordance with implementations of the disclosure. FIG. 7A illustrates image light 290 encountering metasurface lens layer 741. Metasurface lens layer 741 is disposed over the imaging pixels (e.g. imaging pixel 752) of an image pixel array (e.g. image pixel array 602). Example imaging pixel 752 includes subpixel 752A and subpixel 752B in FIG. 7A.

FIG. 7B illustrates a perspective view of example imaging pixel 752 including four subpixels 752A, 752B, 752C, and 752D.

FIG. 7A shows subpixel 752A as a monochrome subpixel that measures/senses the intensity of visible light while subpixel 752B is illustrated as an infrared subpixel. Subpixel 752B may be configured to measure/sense a particular band of infrared light (e.g. 800 nm light) or to measure/sense broad-spectrum infrared light having a wavelength higher than visible red light. Subpixel 752A includes a filter 238 in filter layer 237 that may be configured to pass visible light (while rejecting/blocking non-visible light) to a sensing region 711A in a semiconductor layer 745 of imaging pixel 752. Subpixel 752B includes a filter 239 that may be configured to pass broad-spectrum infrared light (e.g. ~700 nm-3000 nm) or narrow-band infrared light (e.g. 795 nm to 805 nm) to sensing region 711B in a semiconductor layer 745 of imaging pixel 752. Sensing region 711A of subpixel 752A and sensing region 711B of subpixel 752B may be implemented in doped silicon included in semiconductor layer 745. Deep Trench Isolation (DTI) and metal layers may separate the sensing regions of different subpixels. Each subpixel of imaging pixel 752 may be 1-2 microns.

FIG. 7A shows that layer 235 may be disposed between metasurface lens layer 741 and filter layer 237. Layer 235 may include DTI and/or back side metal (BSM). Optional oxide layer 243 is shown disposed between semiconductor layer 745 and filter layer 237. Wavelength filtering layer 237 may include example filters 238 and 239. Layer 237 is disposed between semiconductor layer 745 and metasurface lens layer 741. Those skilled in the art appreciate that layers 235, 237, layer 243, and layer 745 may extend to many imaging pixels in an image pixel array even though FIG. 7A only illustrates a single imaging pixel 752.

FIG. 7B illustrates that example imaging pixel 752 includes four subpixels where two of the subpixels (752A and 752C) may be mono subpixels configured to measure/sense an intensity of image light 290 and one subpixel 752B that may be configured to measure/sense infrared light. Other wavelength filters and different filter patterns may also be used in imaging pixels, in accordance with implementations of the disclosure. Subpixel 752D may include a red, green, or blue filter that passes red, green, or blue light to a sensing region of subpixel 752D. In some implementations, imaging pixels include a red-green-green-blue (RGGB) filter pattern, for example. Each subpixel of imaging pixel 752 may be 1-2 microns. In FIG. 7B, metasurface lens layer 741 includes microlens regions configured to focus image light 290 to subpixels 752A, 752B, 752C, and 752D.

Figure 11A:
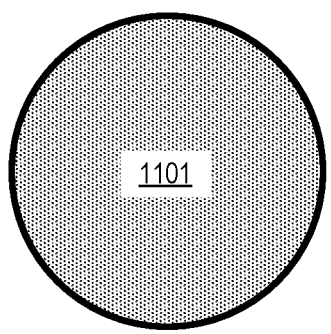
FIGS. 11A-14B illustrate various nanostructures that may be included in microlens regions of metasurface lens layer, in accordance with aspects of the disclosure.
Figure 12A:
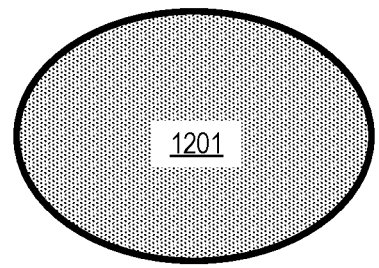
Figure 11B:
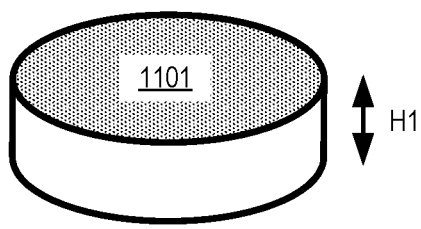
Figure 12B:
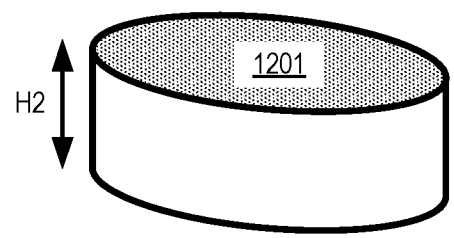
Figure 13A:
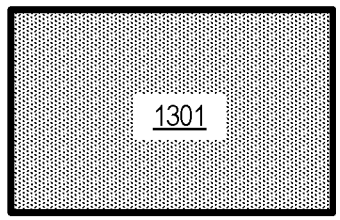
Figure 14A:
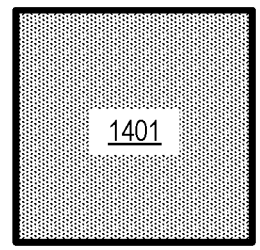
Figure 13B:
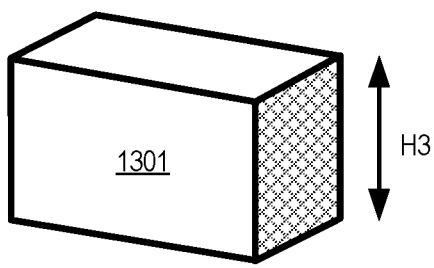
Figure 14B:
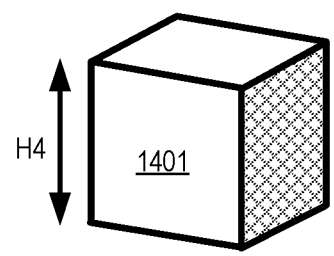

FIGS. 11A-14B illustrate various nanostructures that may be included in microlens regions of metasurface lens layer, in accordance with aspects of the disclosure. The nanostructures of FIGS. 11A-14B may be also referred to as meta-units of a metasurface lens layer. FIG. 11A illustrates a top view of a circular nanostructure 1101 and FIG. 11B illustrates a perspective view of nanostructure 1101 having a height H1. FIG. 12A illustrates a top view of an oval nanostructure 1201 and FIG. 12B illustrates a perspective view of nanostructure 1201 having a height H2. FIG. 13A illustrates a top view of a rectangular nanostructure 1301 and FIG. 13B illustrates a perspective view of nanostructure 1301 having a height H3. FIG. 14A illustrates a top view of a square nanostructure 1401 and FIG. 14B illustrates a perspective view of nanostructure 1401 having a height H4. Other shapes of nanostructures including non-symmetric nanostructures may also be used, in accordance with aspects of the disclosure.

The microlens regions of the metasurface lens layers may include two-dimensional or one-dimensional nanostructures. The height of the nanostructures may be between 50 nm and approximately two microns, for example. The width or length of the nano structures may be between 10 nm and approximately 500 nm, in some implementations. To form the metasurface lens layer, the nanostructures may be formed out of a planar substrate (e.g. silicon, silicon-nitride, or titanium-oxide) using a subtractive process (e.g. photolithography and/or etching). Therefore, the resulting metasurface lens layer having microlens regions may be considered a flat optical component with only minor thickness variations (the height/thickness of the various nanostructures of the metasurface). The metasurface design of each microlens region of the metasurface lens layer may be configured to focus image light to subpixels of an image pixel array.

Furthermore, in some implementations, the metasurface design of the microlens regions may be further configured to pass/transmit or block/reject particular wavelengths and/or polarization orientations of image light 290. In an implementation, wavelength filtering features of a metasurface are formed using metasurface-based subtractive color filter fabrication techniques that may include forming the metasurface on a glass wafer using CMOS processing techniques.

Figure 8:
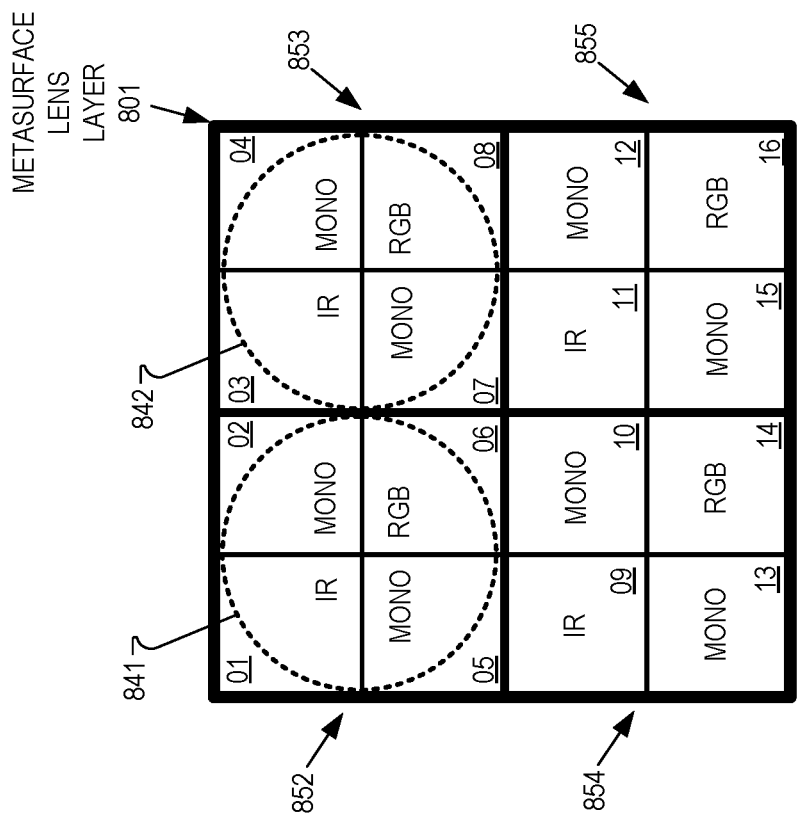
FIG. 8 illustrates a metasurface lens layer arranged with microlens regions to be disposed over subpixels, in accordance with aspects of the disclosure.

FIG. 8 illustrates a metasurface lens layer 801 arranged with microlens regions to be disposed over subpixels, in accordance with aspects of the disclosure. In FIG. 8, microlens region 841 is illustrated as a round or oval microlens region configured to focus image light to four subpixels 01, 02, 05, and 06 of imaging pixel 852. Hence, microlens region 841 has a one-to-one correspondence with imaging pixel 852. Subpixel 01 is configured to measure/sense infrared light, subpixel 02 is configured to measure/sense the intensity of visible light, subpixel 05 is configured to measure/sense the intensity of visible light, and subpixel 06 is configured to measure/sense red, green, or blue light. Of course, the different subpixels may be configured to sense different wavelengths of light by changing the filters in the filter layer of the subpixel.

Microlens region 842 is disposed over imaging pixel 853. Microlens region 842 is illustrated as a round or oval microlens region configured to focus image light to four subpixels 03, 04, 07, and 08 of imaging pixel 853. Hence, microlens region 842 has a one-to-one correspondence with imaging pixel 853. Subpixel 03 is configured to measure/sense infrared light, subpixel 04 is configured to measure/sense the intensity of visible light, subpixel 07 is configured to measure/sense the intensity of visible light, and subpixel 08 is configured to measure/sense red, green, or blue light. While not particularly illustrated, an oval, circular, or rectangular microlens region of metasurface lens layer 801 may be disposed over subpixels 09, 10, 13, and 14 of imaging pixel 854. And, an oval, circular, or rectangular microlens region of metasurface lens layer 801 may be disposed over subpixels 11, 12, 15, and 16 of imaging pixel 855.

Metasurface lens layer 801 may be a contiguous layer. A contiguous metasurface lens layer 801 may cover an entire image pixel array where the image pixel array includes thousands or millions of imaging pixels.

Figure 9:
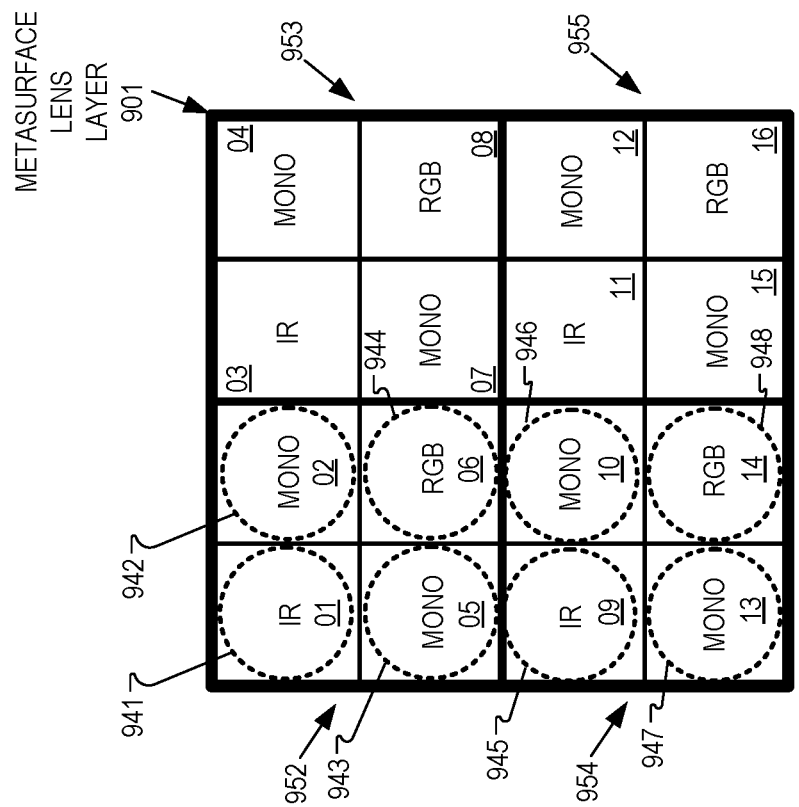
FIG. 9 illustrates a metasurface lens layer including microlens regions having a one-to-one correspondence with subpixels of the imaging pixels, in accordance with aspects of the disclosure.

FIG. 9 illustrates a metasurface lens layer 901 including microlens regions having a one-to-one correspondence with subpixels of the imaging pixels, in accordance with aspects of the disclosure. In FIG. 9, microlens region 941 is illustrated as a round or oval microlens region configured to focus image light to one subpixel (subpixel 01). Microlens region 942 is configured to focus image light to subpixel 02, microlens region 943 is configured to focus image light to subpixel 05, and microlens region 944 is configured to focus image light to subpixel 06. Hence, microlens regions of metasurface lens layer 901 have a one-to-one correspondence with subpixels of imaging pixel 952 that includes subpixels 01, 02, 05, and 06. Similarly, microlens regions 945, 946, 947, and 948 of metasurface lens layer 901 have a one-to-one correspondence to subpixels 09, 10, 13, and 14, respectively, of imaging pixel 954. In other words, metasurface lens layer 901 is configured to have a microlens region to focus image light (e.g. image light 290) for each subpixel in FIG. 9.

Still referring to FIG. 9, subpixel 01 is configured to measure/sense infrared light, subpixel 02 is configured to measure/sense the intensity of visible light, subpixel 05 is configured to measure/sense the intensity of visible light, and subpixel 06 is configured to measure/sense red, green, or blue light. Of course, the different subpixels may be configured to sense different wavelengths of light by changing the filters in the filter layer of the subpixel. While not particularly illustrated, an oval, circular, or rectangular microlens region of metasurface lens layer 901 may be disposed (individually) over subpixels 03, 04, 07, and 08 of imaging pixel 953. And, an oval, circular, or rectangular microlens region of metasurface lens layer 901 may be disposed (individually) over subpixels 11, 12, 15, and 16 of imaging pixel 955.

Metasurface lens layer 901 may be a contiguous layer. A contiguous metasurface lens layer 901 may cover an entire image pixel array where the image pixel array includes thousands or millions of imaging pixels.

In an implementation, the metasurface lens layers of the disclosure are polarization-dependent. In one implementation, nanostructures in the metasurface lens layers of the disclosure are configured to pass/transmit a first polarization orientation to the imaging pixels and reject/block a second (different) polarization orientation from becoming incident on the imaging pixels. In one implementation, the first polarization orientation is orthogonal to the second polarization orientation. In an implementation, nanostructures in the metasurface lens layer are configured to pass right-hand circularly polarized light and block left-hand circularly polarized light. In an implementation, nanostructures in the metasurface lens layer are configured to pass left-hand circularly polarized light and block right-hand circularly polarized light.

In an implementation, nanostructures in the metasurface lens layer are configured to: (1) pass a first wavelength band of image light to a first subpixel and not a second subpixel; and (2) pass a second (different) wavelength band of the image light to the second subpixel and not the first subpixel.

Figure 10:
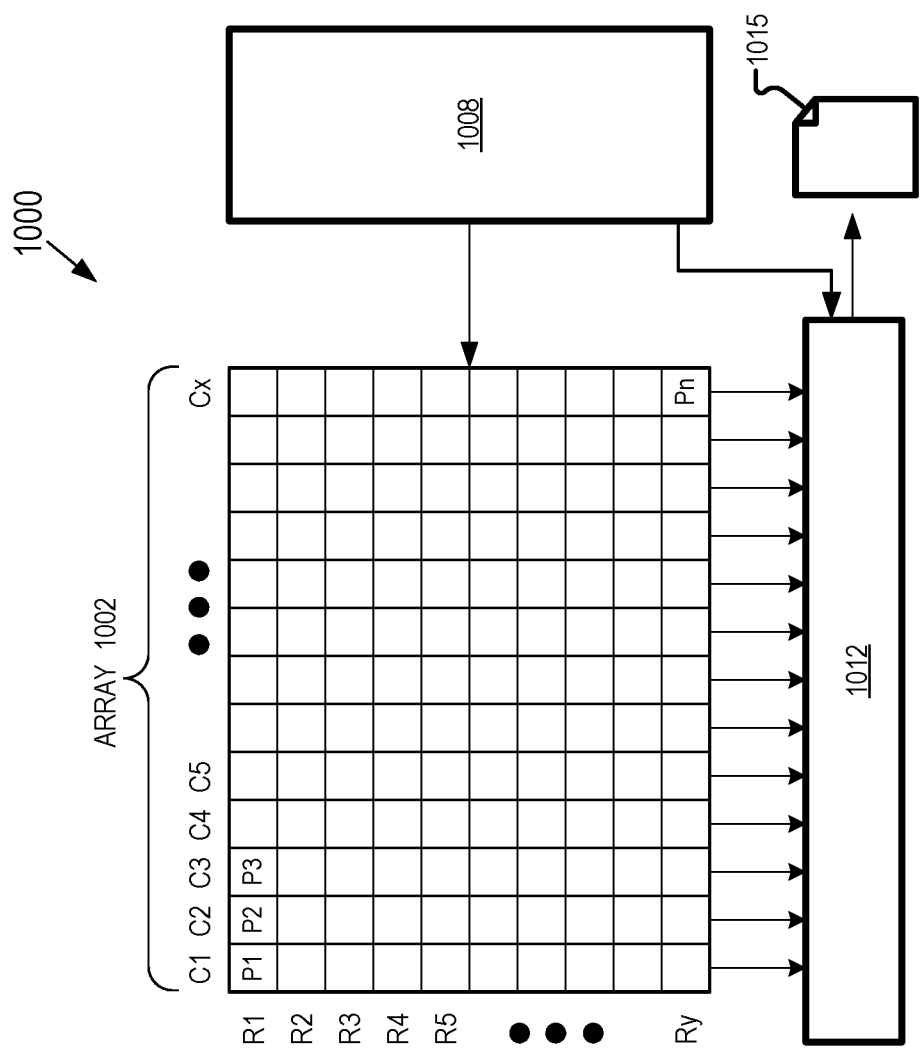
FIG. 10 illustrates an imaging system that may include a metasurface lens layer, in accordance with aspects of the disclosure.

FIG. 10 illustrates an imaging system 1000 that may include a metasurface lens layer, in accordance with aspects of the disclosure. All or portions of imaging system 1000 may be included in an image sensor, in some implementations. Imaging system 1000 includes control logic 1008, processing logic 1012, and image pixel array 1002. Image pixel array 1002 may be arranged in rows and columns where integer y is the number of rows and integer x is the number of columns. The image pixel array 1002 may have a total of n pixel (P) and integer n may be the product of integer x and integer y. In some implementations, n is over one million imaging pixels. Each imaging pixel may include subpixels described in the disclosure.

In operation, control logic 1008 drives image pixel array 1002 to capture an image. Image pixel array 1002 may be configured to have a global shutter or a rolling shutter, for example. Each subpixel may be configured in a 3-transistor (3T) or 4-transistor (4T) readout circuit configuration. Processing logic 1012 is configured to receive the imaging signals from each subpixel. Processing logic 1012 may perform further operations such as subtracting or adding some imaging signals from other imaging signals to generate image 1015. Aspects of a metasurface lens layer in accordance with FIGS. 6-9 of this disclosure may be disposed over image pixel array 1002 in imaging system 1000. In an implementation, metasurface lens layer 801 is disposed over image pixel array 1002 in imaging system 1000. In an implementation, metasurface lens layer 901 is disposed over image pixel array 1002 in imaging system 1000.

Figure 15B:
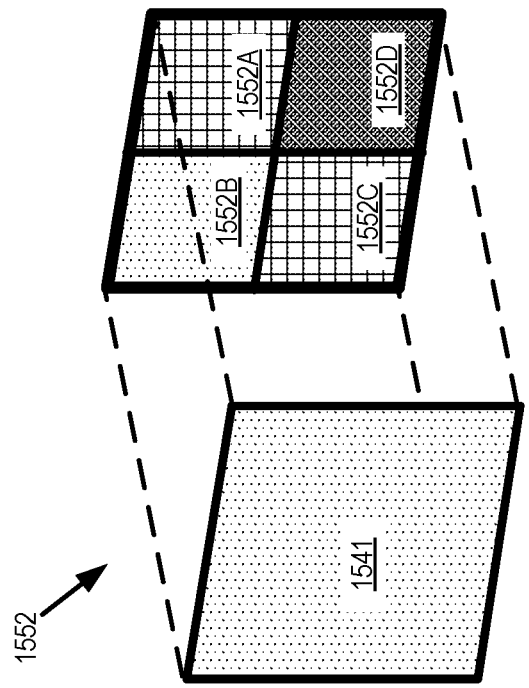
FIGS. 15A-15B illustrate an example imaging pixel having a multi-functional microlens layer, in accordance with aspects of the disclosure.
Figure 15A:
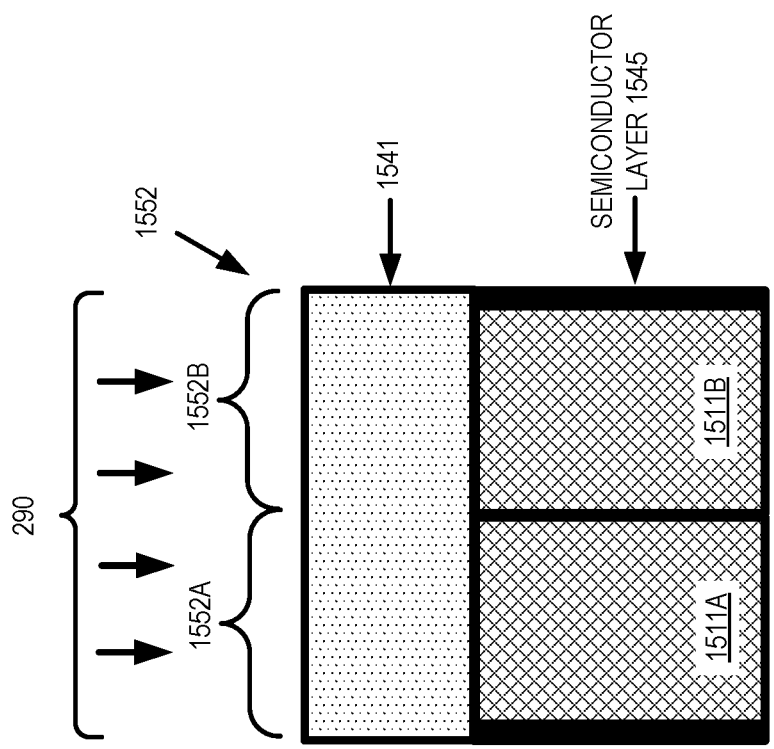

FIG. 15A illustrates a side view of an example imaging pixel 1552 having a multi-functional microlens layer 1541, in accordance with implementations of the disclosure. Multi-functional microlens layer 1541 may function as (1) a microlens and polarizer; (2) a microlens and a wavelength filter; or (3) a combination of microlens, polarizer, and wavelength filter. By combining the functionality of the microlens layer and a filtering layer and/or a polarizing layer, an image sensor may become smaller, less expensive, and reduce the fabrication steps in the manufacturing process. Multi-functional microlens layer 1541 may be implemented as a patterned LCPH layer. In an implementation, multi-functional microlens layer 1541 is implemented as a patterned LCPH layer designed as an LC-PBP. If the patterned LCPH layer includes wavelength filtering functionality, liquid crystals in the patterned LCPH layer may be doped with color dye to provide a filter for specific wavelength bands or to block specific wavelengths. Multi-functional microlens layer 1541 may be implemented as a metasurface, in accordance with implementations previously describe in this disclosure.

FIG. 15A illustrates image light 290 encountering multi-functional microlens layer 1541. Multi-functional microlens layer 1541 is disposed over the imaging pixels (e.g. imaging pixel 1552) of an image pixel array. Example imaging pixel 1552 includes subpixel 1552A and subpixel 1552B in FIG. 15A. FIG. 15B illustrates a perspective view of example imaging pixel 1552 including four subpixels 1552A, 1552B, 1552C, and 1552D.

FIG. 15A shows subpixel 1552A as a monochrome subpixel that measures/senses the intensity of visible light while subpixel 1552B is illustrated as an infrared subpixel. The light filtering functionality is provided by a microlens region of multi-functional microlens layer 1541. Subpixel 1552B may be configured to measure/sense a particular band of infrared light (e.g. 800 nm light) or to measure/sense broad-spectrum infrared light having a wavelength higher than visible red light. Again, this light filtering functionality is provided by a microlens region of multi-functional microlens layer 1541. Sensing region 1511A of subpixel 1552A and sensing region 1511B of subpixel 1552B may be implemented in doped silicon included in semiconductor layer 1545. Deep Trench Isolation (DTI) and metal layers may separate the sensing regions of different subpixels. Each subpixel of imaging pixel 1552 may be 1-2 microns.

FIG. 15B illustrates that example imaging pixel 1552 includes four subpixels where two of the subpixels (1552A and 1552C) may be mono subpixels configured to measure/sense an intensity of image light 290 and one subpixel 1552B that may be configured to measure/sense infrared light. Subpixel 1552D may be configured to measure/sense red, green, or blue light propagating to a sensing region of subpixel 1552D. The filtering functionality for each subpixels may be provided by a microlens region of multi-functional microlens layer 1541 disposed above the particular subpixel. Similarly, polarization filtering for each subpixel may also be provided by a microlens region of multifunctional microlens layer 1541 disposed above the particular subpixel. Each subpixel of imaging pixel 1552 may be 1-2 microns.

Figure 16:
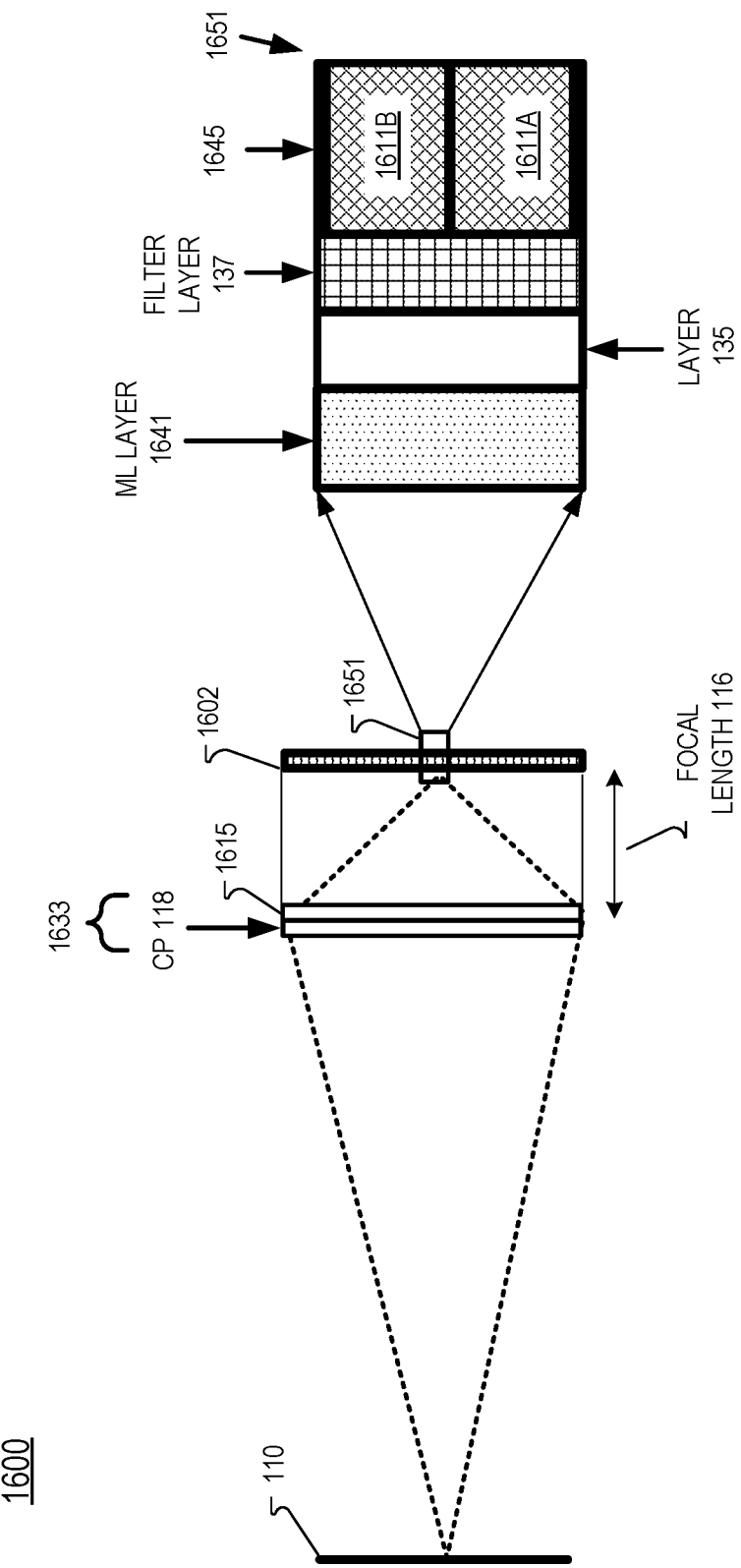
FIG. 16 illustrates a camera system that includes a lens assembly having a diffractive focusing element, in accordance with aspects of the disclosure.

FIG. 16 illustrates a camera system 1600 that includes a lens assembly 1633 having a diffractive focusing element 1615, in accordance with implementations of the disclosure. Diffractive focusing element 1615 may be in implemented as an LC-PBP lens or a metasurface lens. Diffractive focusing element 1615 has a focal length 116 to focus image light onto image pixel array 1602. Lens assembly 1633 may include diffractive focusing element 1615 and circular polarizer 118. Circular polarizer 118 may pass a particular handed polarization orientation (e.g. right-hand polarized or left-hand polarized light) to diffractive focusing element 1615. Image pixel array 1602 may be implemented as a CMOS image sensor, in some implementations. Lens assembly 1633 is configured to focus image light scattered/reflected from object 110 to imaging pixels of image pixel array 1602. Image pixel array 1602 includes a plurality of imaging pixels such as imaging pixel 1651. Imaging pixel 1651 includes a first subpixel 1611A and a second subpixel 1611B. A filter layer 137 may include different wavelength filters (e.g. red, green, blue, infrared, near-infrared) to filter the wavelength of image light that propagates to a semiconductor layer 1645 (e.g. silicon) of imaging pixel 1651. A spacer layer 135 may be disposed between microlens layer 1641 and filter layer 137. Spacer layer 135 may include Deep Trench Interface (DTI) or Buried Shielding Metal (BSM), for example.

Microlens layer 1641 includes microlens regions for focusing the image light to subpixels 1611A and 1611B. Microlens layer 1641 may be implemented as a patterned LCPH or a metasurface layer having the features described above in this disclosure. Replacing a conventional refractive lens (formed of glass of plastic, for example), greatly reduces the height of the camera system 1600 and reduces the weight.

Figure 17A:
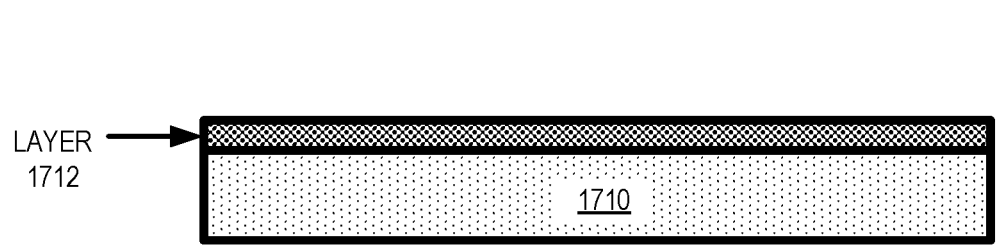
FIGS. 17A-17C illustrate an example process for fabricating an LCPH, in accordance with aspects of the disclosure.
Figure 17B:
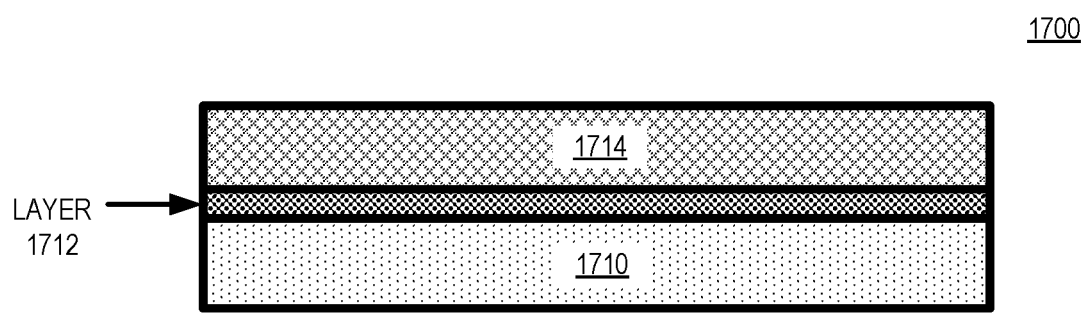
Figure 17C:
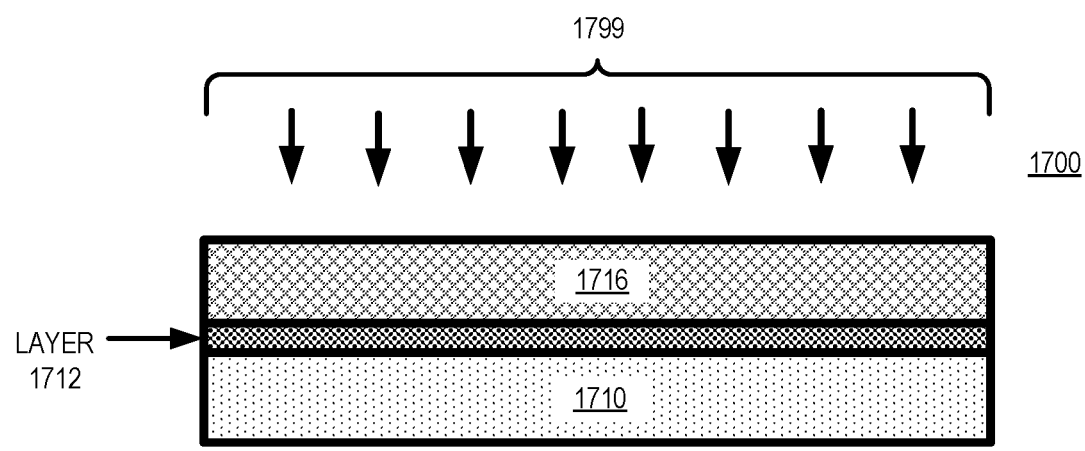

FIGS. 17A-17C illustrate an example process for fabricating an LCPH, in accordance with implementations of the disclosure. In FIG. 17A, a photoalignment material (PAM) 1712 is formed on a glass layer 1710 using a spincoat technique to form optical structure 1700. In FIG. 17B, a liquid crystal monomer layer 1714 is formed on PAM layer 1712 using a spincoat technique. In FIG. 17C, optical structure 1700 is illuminated by ultraviolet (UV) light to photo-polymerize liquid crystal monomer layer 1714 according to the particular configuration of the LCPH under fabrication.

Embodiments of the invention may include or be implemented in conjunction with an artificial reality system. Artificial reality is a form of reality that has been adjusted in some manner before presentation to a user, which may include, e.g., a virtual reality (VR), an augmented reality (AR), a mixed reality (MR), a hybrid reality, or some combination and/or derivatives thereof. Artificial reality content may include completely generated content or generated content combined with captured (e.g., real-world) content. The artificial reality content may include video, audio, haptic feedback, or some combination thereof, and any of which may be presented in a single channel or in multiple channels (such as stereo video that produces a three-dimensional effect to the viewer). Additionally, in some embodiments, artificial reality may also be associated with applications, products, accessories, services, or some combination thereof, that are used to, e.g., create content in an artificial reality and/or are otherwise used in (e.g., perform activities in) an artificial reality. The artificial reality system that provides the artificial reality content may be implemented on various platforms, including a head-mounted display (HMD) connected to a host computer system, a standalone HMD, a mobile device or computing system, or any other hardware platform capable of providing artificial reality content to one or more viewers.

The term "processing logic" in this disclosure may include one or more processors, microprocessors, multi-core processors, Application-specific integrated circuits (ASIC), and/or Field Programmable Gate Arrays (FPGAs) to execute operations disclosed herein. In some embodiments, memories (not illustrated) are integrated into the processing logic to store instructions to execute operations and/or store data. Processing logic may also include analog or digital circuitry to perform the operations in accordance with embodiments of the disclosure.

A "memory" or "memories" described in this disclosure may include one or more volatile or non-volatile memory architectures. The "memory" or "memories" may be removable and non-removable media implemented in any method or technology for storage of information such as computer-readable instructions, data structures, program modules, or other data. Example memory technologies may include RAM, ROM, EEPROM, flash memory, CD-ROM, digital versatile disks (DVD), high-definition multimedia/data storage disks, or other optical storage, magnetic cassettes, magnetic tape, magnetic disk storage or other magnetic storage devices, or any other non-transmission medium that can be used to store information for access by a computing device.

Networks may include any network or network system such as, but not limited to, the following: a peer-to-peer network; a Local Area Network (LAN); a Wide Area Network (WAN); a public network, such as the Internet; a private network; a cellular network; a wireless network; a wired network; a wireless and wired combination network; and a satellite network.

Communication channels may include or be routed through one or more wired or wireless communication utilizing IEEE 802.11 protocols, BlueTooth, SPI (Serial Peripheral Interface), I$^2$C (Inter-Integrated Circuit), USB (Universal Serial Port), CAN (Controller Area Network), cellular data protocols (e.g. 3G, 4G, LTE, 5G), optical communication networks, Internet Service Providers (ISPs), a peer-to-peer network, a Local Area Network (LAN), a Wide Area Network (WAN), a public network (e.g. "the Internet"), a private network, a satellite network, or otherwise.

A computing device may include a desktop computer, a laptop computer, a tablet, a phablet, a smartphone, a feature phone, a server computer, or otherwise. A server computer may be located remotely in a data center or be stored locally.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific embodiments disclosed in the specification. Rather, the scope of the invention is to be determined entirely by the following claims, which are to be construed in accordance with established doctrines of claim interpretation.

What is claimed is:

1. An image sensor comprising:
    imaging pixels including a first subpixel configured to sense image light and a second subpixel configured to sense the image light; and
    a patterned liquid crystal polarization hologram (LCPH) layer having microlens regions disposed over the imaging pixels, wherein the microlens regions are configured to focus the image light to the first subpixel and the second subpixel of the imaging pixels, wherein liquid crystals in the patterned LCPH layer are doped to:
        pass a first wavelength band of the image light to the first subpixel and not the second subpixel; and
        pass a second wavelength band of the image light to the second subpixel and not the first subpixel.

2. The image sensor of claim 1, wherein the microlens regions have a one-to-one correspondence with subpixels of the imaging pixels.

3. The image sensor of claim 1, wherein the microlens regions have a one-to-one correspondence with the imaging pixels.

4. The image sensor of claim 1, wherein the microlens regions are rectangular.

5. The image sensor of claim 1, wherein the microlens regions of the LCPH layer have a longest dimension of less than four microns wide.

6. An image sensor comprising:
    imaging pixels including a first subpixel configured to sense image light and a second subpixel configured to sense the image light; and
    a metasurface lens layer having microlens regions disposed over the imaging pixels, wherein the microlens regions are configured to focus the image light to the first subpixel and the second subpixel of the imaging pixels, and wherein nanostructures in the metasurface lens layer are configured to pass a first polarization orientation to the imaging pixels and reject a second polarization orientation from becoming incident on the imaging pixels, the first polarization orientation different from the second polarization orientation.

7. The image sensor of claim 6, wherein the nanostructures in the metasurface lens layer are configured to:
    pass a first wavelength band of the image light to the first subpixel and not the second subpixel; and
    pass a second wavelength band of the image light to the second subpixel and not the first subpixel.

8. The image sensor of claim 6, wherein the metasurface lens layer includes non-symmetric nanostructures.

9. The image sensor of claim 6, wherein the metasurface lens layer is polarization-dependent.

10. The image sensor of claim 6, wherein nanostructures of the metasurface lens layer are formed of at least one of silicon, silicon-nitride, or titanium-oxide.

11. The image sensor of claim 6, wherein the microlens regions have a one-to-one correspondence with subpixels of the imaging pixels.

12. The image sensor of claim 6, wherein the microlens regions have a one-to-one correspondence with the imaging pixels.

13. The image sensor of claim 6, wherein the microlens regions are rectangular.

14. An image sensor comprising:
    imaging pixels including a first subpixel configured to sense image light and a second subpixel configured to sense the image light;
    a patterned liquid crystal polarization hologram (LCPH) layer having microlens regions disposed over the imaging pixels, wherein the microlens regions are configured to focus the image light to the first subpixel and the second subpixel of the imaging pixels; and
    a wavelength filtering layer disposed between a semiconductor layer of the imaging pixels and the patterned LCPH layer.

15. An image sensor comprising:
    imaging pixels including a first subpixel configured to sense image light and a second subpixel configured to sense the image light; and
    a patterned liquid crystal polarization hologram (LCPH) layer having microlens regions disposed over the imaging pixels, wherein the microlens regions are configured to focus the image light to the first subpixel and the second subpixel of the imaging pixels, and wherein the patterned LCPH layer includes a polarized volume hologram (PVH) design.

16. An image sensor comprising:
    imaging pixels including a first subpixel configured to sense image light and a second subpixel configured to sense the image light; and
    a metasurface lens layer having microlens regions disposed over the imaging pixels, wherein the microlens regions are configured to focus the image light to the first subpixel and the second subpixel of the imaging pixels, and wherein nanostructures of the metasurface lens layer are formed of at least one of silicon, silicon-nitride, or titanium-oxide.

* * * * *